United States Patent [19]

Itoh et al.

[11] Patent Number: 4,482,985
[45] Date of Patent: Nov. 13, 1984

[54] SEMICONDUCTOR INTEGRATED CIRCUIT

[75] Inventors: Kiyoo Itoh, Higashikurume; Ryoichi Hori, Nishitama, both of Japan

[73] Assignee: Hitachi, Ltd., Tokyo, Japan

[21] Appl. No.: 368,162

[22] Filed: Apr. 14, 1982

[30] Foreign Application Priority Data

Apr. 17, 1981 [JP] Japan ................................. 56-57143
Oct. 23, 1981 [JP] Japan ................................. 56-168698

[51] Int. Cl.$^3$ ............................................... G11C 7/00
[52] U.S. Cl. ................................................... 365/226
[58] Field of Search ........................ 365/226, 227, 244

[56] References Cited

U.S. PATENT DOCUMENTS 4,368,524 1/1983 Nakamura et al. ................. 365/226

Primary Examiner—Joseph A. Popek
Attorney, Agent, or Firm—Antonelli, Terry & Wands

[57] ABSTRACT

In order to permit reduced component size without reduction of an external power supply voltage, a semiconductor integrated circuit includes at least three circuits. The first of these three circuits converts the external power source voltage to an internal power source voltage which is smaller than the external power voltage. A second circuit is supplied with the external power source voltage and is responsive to first signals which regulate an operation of the integrated circuit. This second circuit generates second signals which control the integrated circuit so that the integrated circuit performs the desired regulated operation. To carry this out, the second circuit includes at least first transistors which are supplied with the external power source voltage and responsive to the first signals. The second signals generated by the second circuit have amplitudes smaller than those of the first signals. The third circuit is supplied with the internal power source voltage and responsive to the second signals provided by the second circuit to perform the regulated operation. This third circuit includes at least second transistors which are supplied with the internal power source voltage and which have a smaller size than that of the first transistors. Thus, by virtue of this arrangement, the third circuit can carry out the desired regulated operation of the semiconductor integrated circuit using smaller elements and a lower voltage without the need for reducing the external power supply voltage level.

23 Claims, 40 Drawing Figures

|  | PERIPHERAL SUBSIDIARY CIRCUIT | MEMORY ARRAY & PERIPHERAL SUBSIDIARY CIRCUIT |
|---|---|---|
| Lg (μm) | 2.0 ~ 2.5 | 1.2 ~ 1.5 (QA, QB : 3.0) |
| L (um) | 1.5 ~ 2.0 | 0.7 ~ 1.0 (QA, QB : 2.5) |
| tox (Å) | 400 | 200 |
| xj (um) | 0.2 | 0.2 |
| Vth (Volt) | 0.5 ~ 0.3 | 0.3 ~ 0.1 |
| Lp (um) | 1.5 ~ 2.0 | 1 |
| top (Å) | 6000~10000 | 4000~5000 |

SEMICONDUCTOR INTEGRATED CIRCUIT

BACKGROUND OF THE INVENTION

1. Field of the Invention

The present invention relates to a highly dense integrated circuit and, more particularly, to a integrated circuit which is suitable for a highly dense semiconductor memory.

2. Description of the Prior Art

According to the prior art, there is disclosed in Japanese Patent Laid-Open Publication No. 51-104276 a technique, in which two kinds of gate oxide film thicknesses and two kinds of gate region surface concentrations are combined for high integration of a semiconductor memory. In Japanese Patent Laid-Open Publication No. 50-119543, moreover, there is disclosed a concept, in which the channel length or diffusion layer spacing of the transistors of a memory array unit is further reduced by implanting ions of high concentration in the Si surface of the memory array unit thereby to increase the integration. However, in case the size of the circuit elements such as the transistors is reduced by those techniques, the withstand voltage of those circuit elements against dielectric breakdown has to be reduced. Therefore, it is necessary to reduce either the power source voltage to be fed to those circuit elements or the signal voltage to be generated by those circuit elements in accordance with the reduction in the size of the circuit elements.

In view of the usability for the user, on the other hand, it is desired that the voltage impressed from the outside (i.e., the voltage impressed upon the power source pin of the package of a memory LSI) be constant irrespective of the size of the transistors constructing the memory. It is, therefore, undesirable to reduce the externally impressed voltage. As a result, the conventional techniques thus far described have failed to realize such a highly integrated memory as can use a high external voltage. This fact is not limited to the memory but applies to other integrated circuit circuitry as well.

SUMMARY OF THE INVENTION

It is, therefore, an object of the present invention to provide a semiconductor integrated circuit which is highly integrated to have a high density by reducing the size of its circuit elements and which is made operative when it receives a usual power source voltage.

Other objects of the present invention will become apparent from the following description.

According to a feature of the present invention, there is provided a semiconductor integrated circuit which comprises: a first circuit made receptive of a first power source voltage for generating a predetermined second power source voltage which is lower than said first power source voltage; a second circuit made receptive of said first power source voltage for generating a second pulse signal to be used with said second power source voltage in response to a first pulse signal which varies within the same voltage range as that of said first power source voltage; and a third circuit made receptive of said second power source voltage and responsive to said second pulse signal, said third circuit including circuit elements having a smaller size than that of the circuit elements which construct said first circuit. Those circuit circuit elements in the second circuit, which are made responsive to a signal having a large amplitude, are made to have a large size so that they may have a high withstand voltage, whereas those circuit elements of the third circuit, which are made responsive to the output signal of the second circuit, are made to have a small size so that they may be highly integrated. The first circuit is constructed of circuit elements having a large size and is made receptive of the high first power source voltage for feeding the second power source voltage, which is lower than that first power source voltage, to the third circuit. Moreover, the second circuit is made operative to feed the third circuit with the signal which has a voltage corresponding to the second power source voltage.

As a result, since the first and second circuit can be fabricated without any problem concerning the withstand voltage whereas the third circuit is constructed of the circuit elements having a smaller size and occupies a larger area in the integrated circuit as a whole, high integration can be achieved when the integrated circuit is considered as a whole.

Next, the following techniques are used as examples for reducing the size:

(1) An oxide film is selectively thinned. As the gate oxide film thickness of an MOST becomes the smaller, generally speaking, normal transistor characteristics are exhibited the more even for a smaller channel length L. Therefore, in order to reduce the channel length L thereby to effect the lay-out in a small area, it is necessary to reduce the gate oxide film thickness. As has been described hereinbefore, however, the withstand voltage (between the drain and the source) is reduced. It is, therefore, important to properly use the operating voltage in accordance with the channel length L, as in the present invention. In an MOS LSI, on the other hand, it is frequently conducted to use that thin oxide film as a capacitor (such as $C_B$ or $C_S$ appearing in FIG. 2). Since, even in this case, a capacitor having a large capacitance can be fabricated even with a small area if a thin gate oxide film is used, it can be used at a portion which can be operated at a low voltage.

(2) The channel length L and the threshold voltage $V_{th}$ of the MOST having a thin gate oxide film are made smaller.

The channel length L and the threshold voltage $V_{th}$ can be reduced as a result that the thin oxide film can be selectively used, as is apparent from the general characteristics of the MOST. As a result, the high integration can be effected without any reduction in the speed by positively adopting the possibility of the reduction. This is because the region of the thin oxide film can fortunately have its L and $V_{th}$ reduced although it has a low operating voltage so that it has to perform nothing but a low-speed operation. The positive reduction of the L and $V_{th}$ will lead to the desired high-speed operation.

(3) Element separation can be facilitated at a region which is operated at a low voltage. As a result, the element separation width can be accordingly reduced. In other words, the desired high integration can be effected. Alternatively, the inter-layer film thickness contributing the element separation characteristics can be reduced. As a result, the more flatness can be effected to reduce the breakage in the wiring (of Al, for example) and to enjoy a high yield.

(4) In order to further emphasize the advantages of the system thus far described, the depth $x_j$ of the diffusion layer of the major portion of both a memory array and a direct peripheral circuit is made smaller than that of an indirect peripheral circuit unit. This is because a MOST having the smaller size can be used for the smaller $x_j$.

BRIEF DESCRIPTION OF THE DRAWINGS

FIGS. 20 to 31 are circuit diagrams showing modifications of FIGS. 14 and 15, respectively;

FIGS. 33 to 36 are circuit diagrams showing other modifications of the block LM, respectively;

DESCRIPTION OF THE PREFERRED EMBODIMENTS

Figure 1:
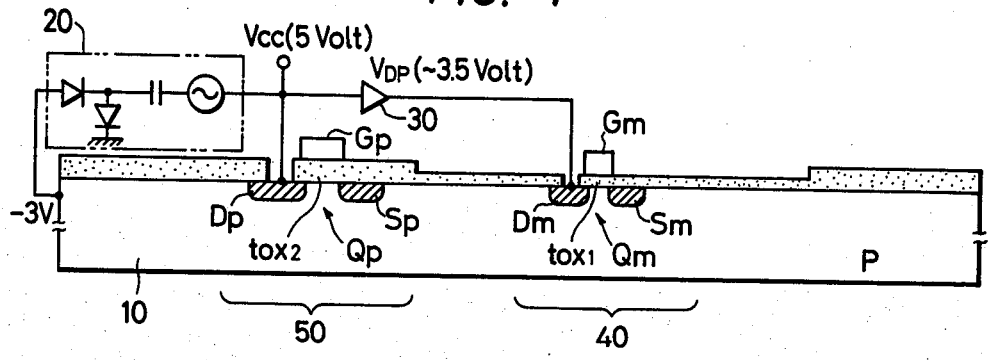
FIG. 1 is a conceptional section showing an embodiment of the present invention.

FIG. 1 is a sectional view of such a memory chip for a dynamic memory as is composed of a P-type substrate 10, and illustrates the concept of the present system. An N-type MOS transistor (which will be shortly referred to "MOST") $Q_p$ has a thicker gate oxide film $t_{ox2}$ than the gate oxide film $t_{ox1}$ of an MOST $Q_m$ and has a drain $D_p$ fed with a higher drain voltage, e.g., an external voltate $V_{cc}$ (e.g., 5 V). The drain $D_m$ of the MOST $Q_m$ is fed with a lower voltage $V_{DP}$ (e.g., 3.5 V) than the voltage $V_{cc}$ by the action of an internal power source voltage generating circuit 30 (which is actually formed in the substrate 10) which in turn is fed with that voltage $V_{cc}$.

This external voltage $V_{cc}$ is fed to a substrate voltage generating circuit 20, by which the bias voltage of the substrate 10, e.g., $-3$ V is generated. Incidentally, the circuit 20 is shown outside of the substrate 10 but is disposed in fact in the substrate 10. Usually, the integration of a memory is determined by the integrations of the memory array and a first circuit unit 40 composed of a peripheral circuit (i.e., a direct peripheral circuit), which is directly connected with the memory array, such as a sense amplifier (although not shown) for either driving that memory array or amplifying a minute signal generated by the memory array. It is, therefore, desired to reduce the size of the MOST $Q_m$ of that portion. This size can be generally reduced from the relationship of the withstand voltage, the hot electrons and the substrate current of the MOST $Q_m$ by dropping the operating voltage. Here, the reduction in the size of the MOST $Q_m$ is realized by thinning the gate oxide film $t_{ox1}$ of the MOST $Q_m$, by dropping the drain voltage to the voltage $V_{DP}$ lower than the external voltage $V_{cc}$ and by reducing the channel length. It is naturally necessary that the maximum of the voltage at the gate $G_m$ be generally at the voltage $V_{DP}$. On the other hand, a second circuit unit 50, which is composed of another control circuit, i.e., a circuit (i.e., an indirect peripheral circuit) for controlling the direct peripheral circuit occupies about 10% of the whole area of the chip thereby to make it unnecessary to use an MOST having an especially small area. Rather, since that indirect peripheral circuit is connected with an external input terminal, its withstand voltage against dielectric breakdown has to be sufficiently high. For this requirement, it is generally necessary to thicken the gate oxide film $t_{ox2}$ of that MOST $Q_p$ and to accordingly enlarge the size (e.g., the channel length) of the MOST $Q_p$ used. Here, since that gate oxide film $t_{ox2}$ is made thicker than the gate oxide film $t_{ox1}$ thereby to enlarge the channel length, the drain voltage of the MOST $Q_p$ is set at the voltage $V_{cc}$ higher than the drain voltage $V_{DP}$ of the MOST $Q_m$. It is quite natural that the maximum of the voltage of the gate $G_p$ is generally set at the external voltage $V_{cc}$. Incidentally, the sources $S_p$ and $S_m$ of the MOSTs $Q_p$ and $Q_m$ are both maintained at the earth potential. As shown in FIG. 1, in short, the size of the MOST $Q_m$ of the first circuit 40, which is constructed of the memory array and the direct peripheral circuit both influencing the high integration, is reduced, whereas the size of the MOST $Q_p$ of the second circuit unit 50 constructed of the indirect peripheral circuit is enlarged. As a result, the MOST $Q_p$ is enabled to operate by using the power source voltage ($V_{cc}$, e.g., at 5 V) from the outside of the chip as the operating voltage. On the other hand, the MOST $Q_m$ is enabled to operate at a lower operating voltage ($V_{CF}$, e.g., 3.5 V) by converting the power source voltage $V_{cc}$ in the chip. Generally speaking, it is desired for the high speed that the threshold voltage $V_{th}$ is dropped the more in accordance with the lower operating voltage. Since, in this respect, the threshold voltage $V_{th}$ is dropped the more in accordance with the general characteristics of an MOST as a gate oxide film $t_{ox}$ is made the smaller, the operating speed of the first circuit unit occupying the major portion of the operating speed of the memory can be accelerated.

Therefore, the present system is advantageous in the high speed. Incidentally, it is apparent that the threshold voltage $V_{th}$ can be properly adjusted by the ion implanting technique in accordance with the application.

Figure 2:
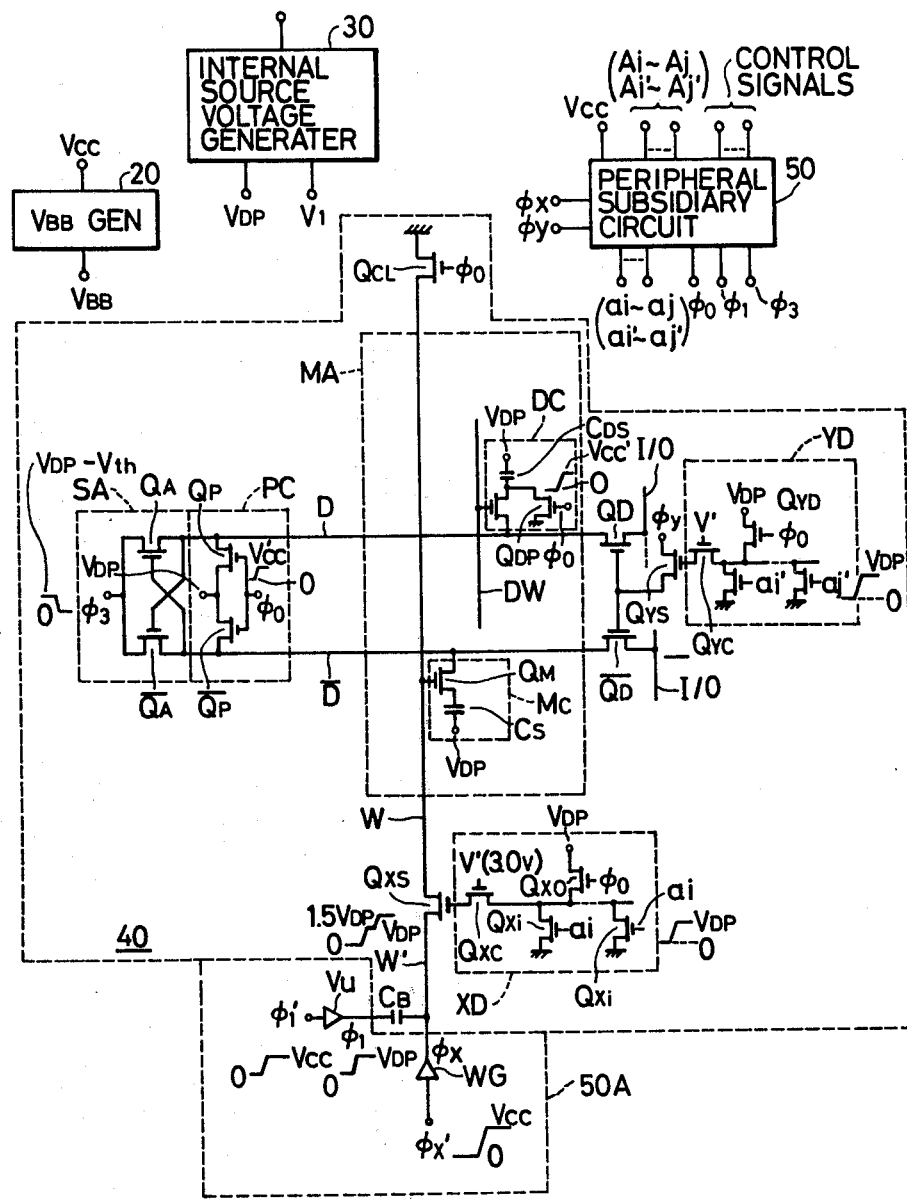
FIG. 2 is a block diagram showing the whole circuit of the embodiment.

The present system can be effectively used by taking several points into consideration in case it is applied to the actual dynamic N-type MOS memory which is constructed of a one-transistor type memory cell. One example is shown in FIG. 2 and is directed to a memory having folded type data lines. This memory is constructed to include: the substrate bias generating circuit 20 made receptive of the external power source voltage $V_{cc}$ (at 5 V) for generating a substrate bias voltage of about −3 V; the internal power source generating circuit 30 made receptive of the external power source voltage $V_{cc}$ for generating the internal power source voltage of 3.5 V and a d.c. voltage V' of about 3 V; the indirect peripheral circuit 50 made receptive of the external power source voltage $V_{cc}$, external addresses Ai to Aj and Ai' to Aj' and an external control signal for generating internal address signals $a_i$ to $a_j$ and $a_i'$ to $a_j'$ and interal control pulses $\phi_o$, $\phi_1$, $\phi_3$, $\phi_x$ and $\phi_y$; and a memory array MA and the direct peripheral circuit 40 adapted to be controlled by the voltages $V_{DP}$, V' and address signals $a_i$ to $a_j$ and $a_i'$ to $a_j'$ and the control pulses $\phi_0$, $\phi_1$ and $\phi_3$. That direct peripheral circuit is composed of an X decoder XD, a Y decoder YD, a precharge circuit PC and a sense amplifier SA. In FIG. 2, incidentally, a circuit 50A corresponds to that portion of the indirect peripheral circuit 50, which is made operative to generate word line drive pulses and is so shown as is separately taken out of the circuit 50. The pulses $\phi_1'$ and $\phi_x'$ shown in that circuit 50A are generated in the indirect peripheral circuit 50.

Here, both the external address signals and the external control signals to be fed to the indirect peripheral circuit 50 are signals which vary between the external power source voltage $V_{cc}$ and the earth potential. Of those pulses fed out of that circuit 50: the pulses $\phi_1$, $a_i$ to $a_j$ and $a_i'$ to $a_j'$ are all pulses which vary between the internal power source voltage $V_{DF}$ and the earth potential; the pulses $\phi_0$ are pulses which take a higher level than the sum of the voltages $V_{DF}$ and $V_{th}$ if this latter voltage $V_{th}$ is designated to mean the threshold value of the pre-charge transistors $Q_P$, $\overline{Q}_P$, $Q_{DP}$, $Q_{YO}$ and $Q_{XO}$; and the pulses $\phi_3$ are pulses which take such a level as is lower than the voltage $V_{DF}$ by the threshold value of transistors $Q_A$ and $\overline{Q}_A$. On the other hand, the pulses $\phi_x$ and $\phi_y$ are pulses which take the level of the voltage $V_{DP}$.

The operations of the circuit thus constructed will be described in the following.

The read-out signal voltages, which are fed from a selected memory cell MC of the memory array MA to appear on a data line $\overline{D}$ in accordance with stored data, are judged to be data "1" and "0" by the sense amplifier SA with reference to a reference voltage which is fed from a dummy cell DC to appear on a data line D, and this process will be described in the following. Specifically, after the respective paired data lines D and $\overline{D}$ have been precharged to the voltage $V_{DP}$ (lower than the voltage $V_{cc}$) by the pre-charge signals $\phi_0$, these signals $\phi_0$ disappear so that the lines D and $\overline{D}$ are maintained at the voltage $V_{DP}$. The amplitude of those precharge signals $\phi_0$ may be sufficiently higher than the voltage $V_{DP}$ (i.e., than the sum of the voltages $V_{DP}$) so that the precharge levels of the lines D and $\overline{D}$ may be prevented from being unbalanced (which produces equivalent noises during the reading operation) by the influences of the fluctuations of the threshold value of the MOSTq $Q_P$ and $\overline{Q}_P$ in the data line pre-charge circuit PC. Next, in order to read out the memory cell MC on a word line W, which is cleared to 0 V by a MOST $Q_{CL}$ during the precharge, the word start pulses $\phi_x'$ (which has an amplitude of the external power source voltage $V_{cc}$) are impressed upon a word voltage generating circuit WG. Since the decoder XD has already been selected by that time by the addresses $a_i$ to $a_j$, a word driver MOST $Q_{XS}$ has its gate maintained at the high level. In other words, the MOST $Q_{XS}$ is rendered conducting. The word voltage generating circuit WG is made responsive to the pulses $\phi_x'$ to generate the pulses $\phi_x$ having an amplitude $V_{DP}$ and has its output $\phi_x$ transmitted as it is from a node W' to the word line W. A booster circuit VU is made receptive of the pulses $\phi_1'$ (which have an amplitude $V_{cc}$) to generate the pulses $\phi_1$. These pulses $\phi_1$ are impressed upon the node W' through the boost trap capacitor $C_B$. As a result, the word line has its voltage boosted. The boost voltage in this case is so determined by the parasitic capacitance, which is the sum of the capacitor $C_B$, the node W' and the line W, and by the amplitude of the pulses $\phi_1$ that it can take a value as high as 0.5 $V_{DP}$. As a result, pulses having an amplitude of about 1.5 $V_{DP}$ are generated on the line W. At the same time, although omitted in FIG. 2, a pulse voltage of 1.5 $V_{DP}$ is generated on the dummy word line DW by a circuit of a similar kind. By these processes, the stored voltage, which has been held in the storage capacitor $C_S$ in accordance with the data, appears on the line $\overline{D}$ as the minute voltage which is determined by the relationship between the memory capacitor $C_S$ and the data line capacitance.

On the line D, on the other hand, there always appears an intermediate level (i.e., the reference voltage) between the signals voltages which have appeared on the line $\overline{D}$ in a manner to correspond to the stored data. That intermediate level is amplified by the sense amplifier SA. Incidentally, the amplification is conducted by dropping the voltage of the pulses $\phi_3$, which have been precharged during the pre-charge by the data lines D and $\overline{D}$ to the level of $V_{DP}-V_{th}$ (which is the voltage $V_{th}$ of the MOSTs $Q_A$ and $\overline{A}_A$), to 0 V. The differential signals of the lines D and $\overline{D}$ thus amplified are fed to I/O and $\overline{I/O}$, which are shared between the respective paired data lines, by selecting the predetermined Y decoder YD by the addresses $a_i'$ and $a_j'$ (so that the gate voltage of a MOST $Q_{YS}$ is raised to the high level) and by impressing the pulses $\phi_y$ which have been boosted to 1.5 $V_{DP}$, until they become the data output.

Now, in the usual memory, the withstand voltage naturally raises a problem if the integration is increased, that is to say, the memory cell is reduced, as has been described hereinbefore, while maintaining the voltage $V_{cc}$ at 5 V. According to the present invention, however, if the operating voltages of the memory cell MC and the dummy cell DC, which have direct relationship with the integration, and the direct peripheral circuit and MOSTs (e.g., SA, PC, XD, YD, $Q_{XS}$, $Q_{YS}$, $Q_D$, $\overline{Q}_D$, DC and $Q_{CL}$), which are laid out with substantially the same pitch as that of the memory cell MC, are dropped, those cells, circuits and MOSTs are cleared of the problem of the withstand voltage so that they can be laid out in a small area by using elements (e.g., MOSTs, capacitors and resistors) having small sizes. On the other hand, since the indirect peripheral circuit occupies a small area in the whole chip area, elements having larger sizes can be used so that a table operation can be ensured at a high operating voltage. In other words, it is possible to provide a highly integrated memory which can operate at a high voltage, as viewed from the outside.

Incidentally, although it is apparent, the elements in the direct peripheral circuit can be used by having their sizes selectively enlarged, as the case may be, if the operating state is taken into consideration. For example, the MOST $Q_{CL}$ is fed with the high voltage of 1.5 $V_{DP}$ between its drain and source thereby to make it necessary to devise the use of an MOST having a larger size.

In the sense amplifier SA, on the other hand, the MOSTs $Q_A$ and $\overline{Q}_A$ may fail to have their threshold values coincide as a result of dispersion in their production if their sizes are reduced so much. Since that incoincidence invites the read-out noises of the memory cell, it is necessary to selectively enlarge the sizes of the MOSTs $Q_A$ and $\overline{Q}_A$.

Figure 3:
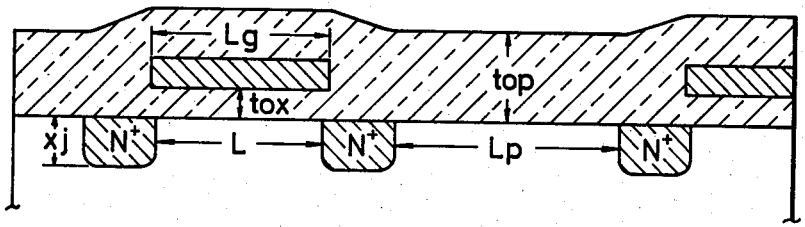
FIG. 3 is a table tabulating the sizes of the respective elements of FIG. 2.

Incidentally, the specific sizes of the elements in the memory of FIG. 2 are exemplified in FIG. 3. The combinations of those various sizes can be selected in accordance with the applications. For example, if the depth $x_j$ of a diffusion layer and the thickness $t_{op}$ of an insulating film are made to have two kinds, as in FIG. 3, the advantage of the present invention can be enjoyed to the maximum. However, those combinations may be of one kind in view of the feasibility of production.

Figure 4:
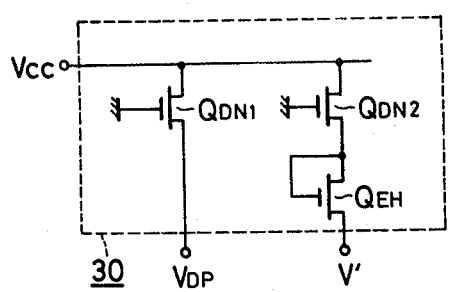
FIG. 4 is a circuit diagram of a block 30 of FIG. 2.
Figure 5:
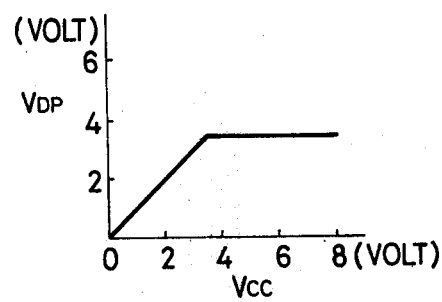
FIG. 5 is a characteristic graph of FIG. 4.

FIG. 4 is a circuit diagram showing the internal power source voltage generating circuit 30. N-channel MOSTs $Q_{DN}1$ and $Q_{DN}2$ of depletion type have their drains fed with the external power source voltage $V_{cc}$. Since the threshold voltage $V_{th}$ of those MOSTs is selected to be $-3.5$ V, the source potential of the MOST $Q_{DN}1$ is maintained at 3.5 V. From this source terminal, there can be generated the internal power source voltage $V_{DP}$, which is impressed upon the respective portions of the memory chip. On the other hand, the source of the MOST $Q_{DN}2$ is connected with the drain and gate of an enhancement type MOST $Q_{EH}$ having a threshold voltage of 0.5 V so that a power source voltage $V'$ of 3.0 V is generated from the source terminal of the latter transistors. FIG. 5 illustrates the relationship between the external and internal power source voltages $V_{cc}$ and $V_{DP}$ of the embodiment under consideration.

Although, in FIG. 4, only one system is shown as a a circuit for generating the voltage $V_{DP}$ and $V'$, a plurality of similar circuits are actually provided in accordance with the necessary current capacity and connected with the respective portions of the memory array and the direct peripheral circuit.

Figure 6:
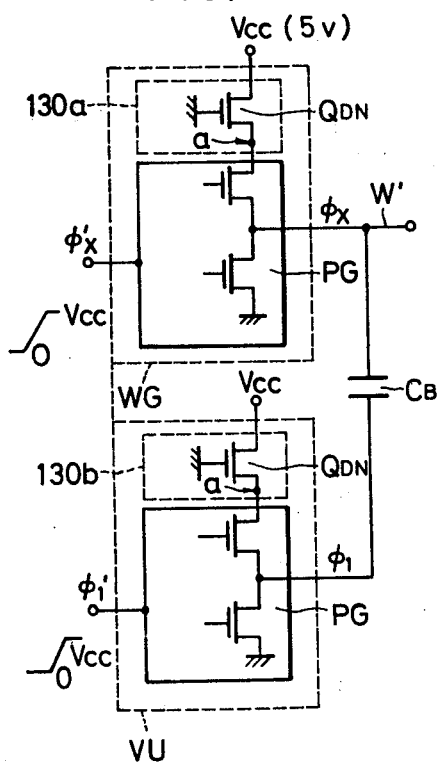
FIG. 6 is a circuit diagram showing block WG and VU of FIG. 2.
Figure 7:
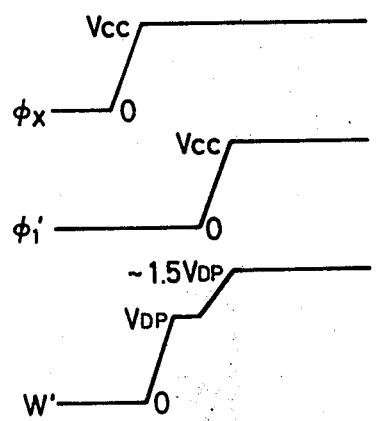
FIG. 7 is a time chart showing the operations of FIG. 6.

On the other hand, FIG. 6 shows the circuit constructions of the word voltage generating circuit WG and the voltage boosting circuit VU of FIG. 2. The operations of these circuits WG and VU are illustrated in wave forms in FIG. 7. Each of the circuits WG and VU is constructed to include: a voltage converter 130a or 130b, which is composed of the depletion type N-channel MOST ($V_{th} = -3.5$ V) $Q_{DN}$; and a conventional pulse generating circuit PG. Although the amplitude of the input pulse voltages $\phi_x'$ and $\phi_1'$ is $V_{cc}$, the voltage at a point a is maintained at 3.5 V by the action of the depletion MOST $Q_{DN}$. The pulse generating circuit PG in the word voltage generating circuit WG generates the pulses $\phi_x$ of the voltage $V_{DP}(=3.5$ V) in response to the rise of the input pulses $\phi_x'$. After that, moreover, the pulse generating circuit PG in the voltage boosting circuit VU generates the pulses $\phi_1$ of the voltage $V_{DP}$ in response to the rise of the input pulses $\phi_1'$ (which have the amplitude $V_{cc}$). As a result, the node W' has its voltage boosted to about 1.5 $V_{DP}$ by the action of the capacitance $C_B$. The output voltage of the circuit PG is substantially constant even with the change in the voltage $V_{cc}$ (e.g., from 5 to 8 V), because it is exclusively determined by the threshold voltage $V_{th}$ of an MOST $Q_{DN}$ (as shown in FIG. 5). This means that the minute MOSTs used in multiplicity in the memory array MA and the direct peripheral circuit can be protected from any breakage even if the voltage $V_{cc}$ is made excessively high.

Figure 8:
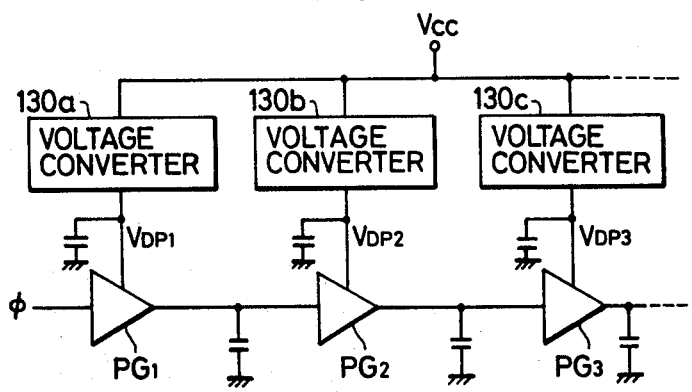
FIG. 8 is a conceptional block diagram showing a block 50 of FIG. 2.
Figure 9:
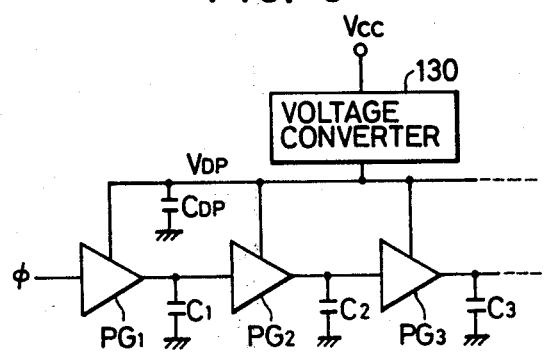
FIGS. 9 to 11 are block diagrams showing modifications of FIG. 8, respectively.

FIG. 8 schematically shows the internal construction of the indirect peripheral circuit. Pulse generating circuits PG1, PG2 and PG3, which are connected in tandem for generating timing signals, are respectively equipped with voltage converters 130a, 130b and 130c which are similar to those shown in FIG. 6, and are respectively fed with a voltage which is equal to the internal power source voltage $V_{DP}$. Moreover, FIG. 9 is a circuit diagram shown in comparison with FIG. 8. The pulse generating circuits are commonly equipped with a voltage converter 130. With the construction shown in FIG. 9, if the current feeding capability of the voltage converter 130 is insufficient, the voltage $V_{DP}$ is fluctuated each time the respective pulse generating circuits PG operate, and those fluctuations continue for a long time if a power source line capacity $C_{DP}$ is high. Specifically, the plural circuits PG interfere with one another in the form of the fluctuations in the voltage $V_{DP}$ so that ideal pulse waveforms cannot be generated by the respective circuits PG. This defect is solved by the construction of FIG. 8.

Figure 10:
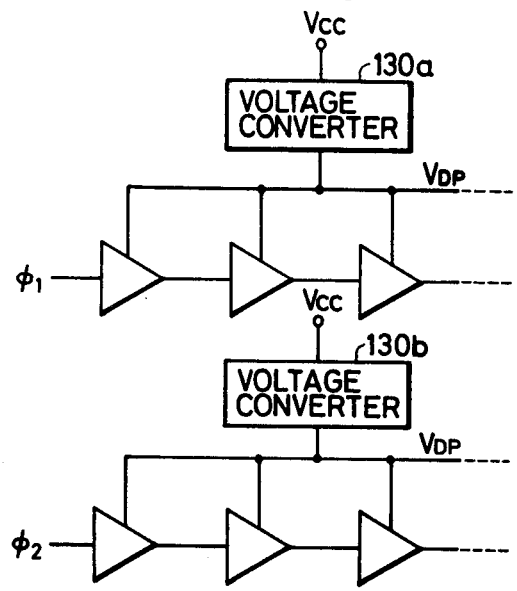
Figure 11:
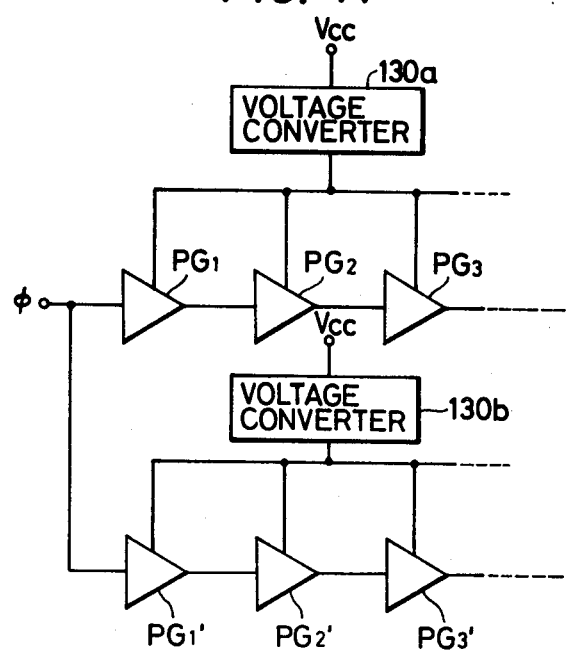
Figure 12:
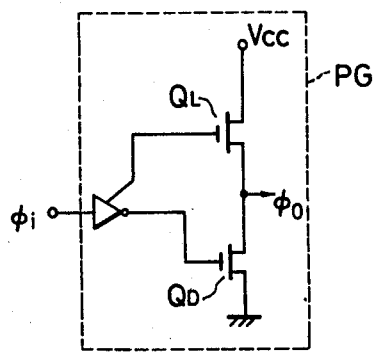
FIG. 12 is a circuit diagram showing one example of the circuit to be used as the block 50 of FIG. 2.

FIG. 10 shows another embodiment for reducing that mutual interference through the voltage $V_{DP}$, which has the defect concomitant with the construction of FIG. 8. The circuits PG constructing the indirect peripheral circuit are classified into plural groups of the circuits PG in accordance with the operating time band such that some circuits PG operated only during a certain time band whereas the remaining plural circuits PG operate during a different time band. As in the dynamic memory of address multiplex type, for example, there exist in the chip two groups of the circuits PG which are made operative to correspond to the tow externally impressed clocks ($\phi_1$ and $\phi_2$), respectively. In this case, if the voltage converters 130a and 103b are used to correspond to the clocks $\phi_1$ and $\phi_2$, there is eliminated that interference through the voltage $V_{DF}$ between the circuits PG, which relates to the clocks $\phi_1$ and $\phi_2$. As shown in FIG. 12, alternatively, it is conceivable to classify the circuits PG into the circuits PG (e.g., PG1, PG2, PG3 and so on), which are made operative in the case of existence of the input signals $\phi$, and the circuits PG (e.g., PG1', PG2', PG3' and so on), which are made operative in the case of nonexistence, that is to say, into two groups of the circuits PG, which are made operative in a manner to correspond to the logic states of the signals $\phi$, and to connect those two groups with the voltage converters 130a and 130b, respectively.

Figure 13:
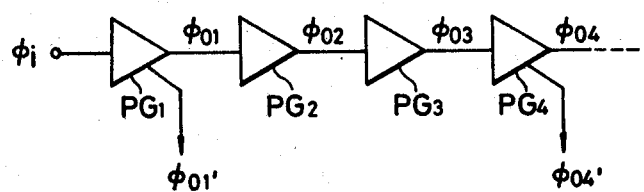
FIG. 13 is a conceptional block diagram of the block 50.

Next, examples other than that of FIG. 6 for the circuit system of the voltage converters themselves will be described in the following. For simplicity, the following description is made by the use of the dynamic type pulse generating circuit which is usually used. The operations of this pulse circuit PG will be described with reference to FIG. 12. Specifically, when the input $\phi_1$ is impressed, the MOST $Q_D$ has its gate voltage discharged from a high potential to a low potential so that it is rendered inconducting, and a MOST $Q_L$ simultaneously has its gate voltage charged to a low potential to a higher potential than the voltage $V_{cc}$ by the use of the boost trap capacitor. As a result, the MOST $Q_L$ is rendered conducting so that the output $\phi_0$ is changed from the low potential (i.e., 0 V) to the high potential (i.e., $V_{cc}$). The generation of the output pulses at the low voltage by the use of the circuit of that type can be effected by the example shown in FIG. 6. As the case may, however, if the pulses $\phi_1$ having an amplitude equal to that of the externally fed power source voltage $V_{cc}$ shown in FIG. 13 are supplied, the amplitude of the outputs $\phi_{01}$ to $\phi_{04}$ of the respective circuits PG is also $V_{cc}$. However, there may be a case, in which pulses (e.g., $\phi_{01}'$ and $\phi_{04}'$) having a lower voltage amplitude $V_{DP}$ are to be generated in a manner to correspond to only a predetermined output. Examples of the voltage converter 130 in this case are shown in FIGS. 14 and 15.

Figure 14:
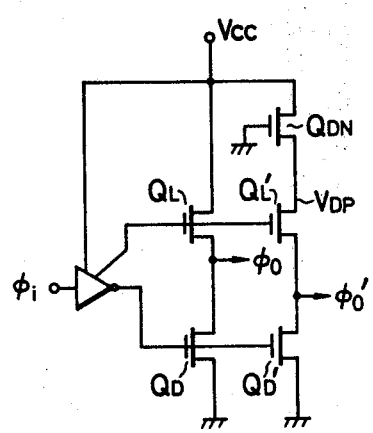
FIGS. 14 to 16 are circuit diagrams showing modifications of a block 130 of FIG. 6, respectively.

FIG. 14 shows an example, in which inverters $Q_L'$ and $Q_D'$ for the pulses $\phi_0'$ are added in parallel to the output step of the circuit of FIG. 12. A MOST $Q_{DN}$ is the same depletion type MOST as that of FIG. 6. On the other hand, FIG. 15 shows an example, in which the same depletion type MOST $Q_{DN}$ as that of FIG. 6 is added in series with the MOSTs $Q_D$ and $Q_L$ so that an output is fed out of both the two terminals thereof. As is apparent, the pulses $\phi_0$ can have an amplitude up to the voltage $V_{cc}$, and the pulses $\phi_0'$, which are regulated by the threshold voltage of the depletion MOST so that it acquires the amplitude $V_{DP}$, are generated at the same time as the pulses $\phi_0$.

Figure 15:
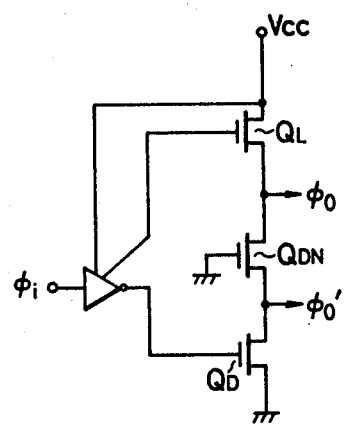
Figure 16:
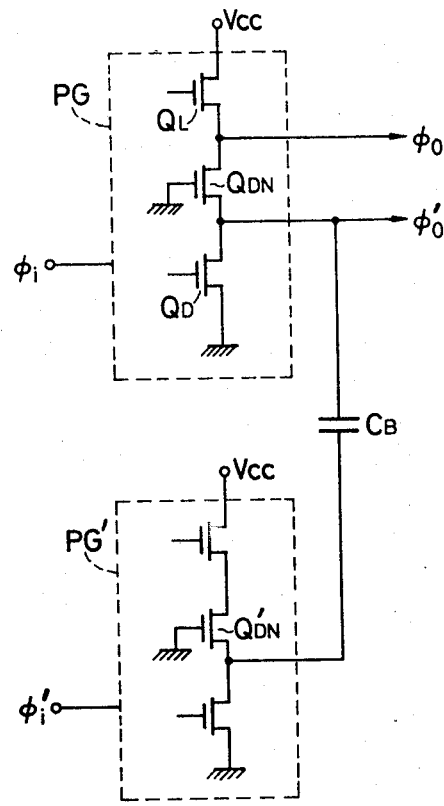

Moreover, FIG. 16 shows an example, in which the pulses $\phi_0'$ of FIG. 15 are boosted, as shown in FIG. 6.

Now, in the various embodiments thus far described, the constant voltage circuit is used as the internal power source voltage generating circuit 30, and the voltage converter 130 used, which is connected with the respective pulse generating circuits included in the indirect peripheral circuit 50, is correspondingly of the constant voltage characteristics.

As a result, even if the external power source voltage (i.e., $V_{cc}$) becomes excessive, the signal voltage to be fed to the memory array and the first circuit unit 40, i.e., the direct peripheral circuit is constant thereby to provide an advantage that the minute MOSTs in the first circuit can be prevented from being broke. On the contrary, there arises a disadvantage that it is difficult to conduct the effective aging tests.

In the usual integrated circuit, after the final fabrication step, the aging test, in which a higher voltage than the voltage used in the usual operation is intentionally impressed upon the respective transistors in the circuit thereby to find out such a transistor at an initial stage as is liable to be troubled by its intrinsic degradation in the gate oxide film, thus ensuring the reliability. In order to improve the finding percentage of the degradation by that aging test, it is necessary to impress such a voltage upon the respective elements as is slightly lower than that for the breakage of the normal elements. However, a sufficient aging voltage is not applied to the aforementioned circuit portion of the low withstand voltage, in the integrated circuit chip which is so constructed as to feed the power source voltage to the circuit portion through the constant voltage circuit in the chip.

Figure 17:
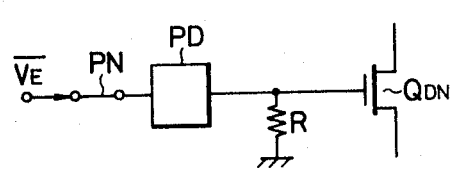
FIGS. 17 and 18 are circuit diagrams showing modifications of FIG. 4, respectively.
Figure 18:
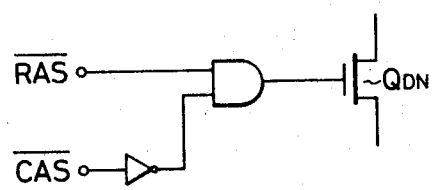

FIGS. 17 and 18 show means for eliminating the aforementioned defect. In either means, the gate voltage of the voltage limiting depletion MOST $Q_{DN}$, which is included in either the internal power source voltage generating circuit 30 shown in FIG. 5 or the voltage converter of FIG. 6 or the lie, is set at the earth potential during the usual operation and at the suitable voltage $V_E$ during the aging operation. In the circuit of FIG. 17, the gate of the MOST $Q_{DN}$ is grounded to the earth in the chip through a resistance R in the chip. On the other hand, the gate is connected through a bonding pad PD with the pin PN of the package. If that pin is left open during the usual operation, the gate of each MOST $Q_{DN}$ is at the earth potential. If that pin is fed with a voltage during the aging operation, on the other hand, a voltage, which is raised by the application of that voltage, is generated at the source of the MOST $Q_{DN}$.

FIG. 18 shows an embodiment, in which the phase relationship of the external clocks to be applied to the chip is adjusted only during the aging operation without any elaborate provision of the aging pin, as in the foregoing description, so that the same effect may be attained. As is well known in the art, for example, a dynamic RAM is operated by the suitable relationship between two kinds of external clocks RAS (i.e., Row Address Strobe) and CAS (Column Address Strobe). Since the combination of the RAS at the high level and the CAS at the low level is not usually used, the reversed combination may be used during the aging operation. By taking the logic shown in FIG. 18, specifically, the gate of the MOST $Q_{DN}$ can be made higher than the earth potential only in case of the aforementioned combination.

Although, in the foregoing embodiments, the voltage $V_{DP}$ limited to a predetermined value has been used as the internal power source voltage, such an internal power source voltage $V_{cc2}$ as can be varied with the variation in the external power source voltage $V_{cc}$ is used in the embodiment to be described while considering the effect of the aforementioned aging test.

Figure 19:
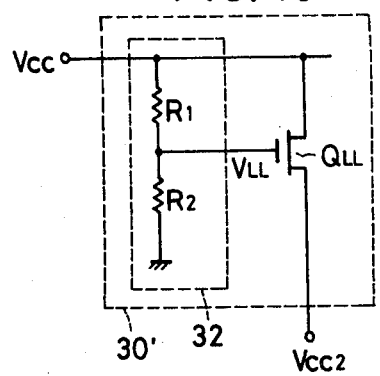
FIG. 19 is a circuit diagram showing another embodiment of FIG. 4.

FIG. 19 shows the basic circuit of the internal power source voltage generating circuit which is used in placed of the circuit of FIG. 4 so as to generate such an internal power source voltage $V_{cc2}$ as can be varied. Voltage dividing means 32, which is composed of resistors $R_1$ and $R_2$, has its middle point connected with the gate of an enhancement type MOST $Q_{LL}$ whereas one terminal of the resistor $R_1$ and the drain of the transistor $Q_{LL}$ are fed with the external power source voltage $V_{cc}$. The internal power source voltage $V_{cc2}$ to be obtained for the output voltage $V_{LL}$ of the voltage dividing means 32 can be expressed by the following Equation:

$$V_{cc2} = V_{LL} - V_{th} \qquad (1),$$

wherein $V_{th}$ designates the threshold voltage of the MOST $Q_{LL}$.

Figure 20:
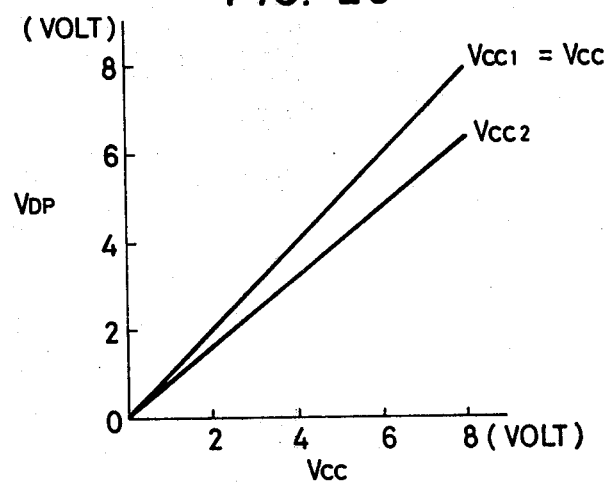
FIG. 20 is a characteristic graph of FIG. 19.

FIG. 20 is a graph showing the variation in the internal power source voltage $V_{cc2}$, which is generated by the circuit of FIG. 19, with reference to the variation in the external power source voltage $V_{cc}$.

Figures 21, 22, 23:
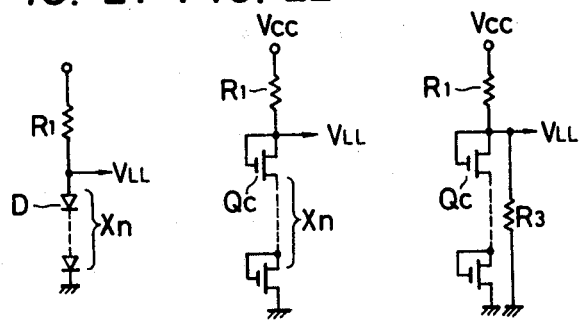
FIGS. 21 to 28 are circuit diagrams and characteristic graphs showing modifications of a block 32 of FIG. 19 and their characteristics, respectively.

Although there is shown in FIG. 20 the example in which the internal power source voltage $V_{cc2}$ is varied with an identical constant of proportion all over the range, it is possible to generate an internal power source voltage $V_{cc2}$ having various characteristics if the voltage dividing means 32 of FIG. 19 is modified. FIG. 21 shows voltage dividing means, which is composed of an n number of diodes D connected in series and the resistor $R_1$. If this voltage dividing means is used as the internal power source voltage generating means, the internal power source voltage $V_{cc2}$ is expressed in FIG. 26. The voltage $V_{cc2(P)}$ at a point P is a voltage at the instant when the n diodes D are turned on and can be substantially expressed by the following Equation:

$$V_{cc2(P)} = n \times V_F \qquad (2),$$

wherein $V_F$ designates the forward voltage of each diode D. The gradient after the point P is determined by the resistance of the resistor $R_1$ and by the equivalent ON resistance $n \cdot R_D$ of the diodes D.

FIG. 22 shows an example in which the aforementioned diodes D are replaced by an MOST $Q_C$. The voltage $V_{cc2(P)}$ at this time is expressed by the following Equation:

$$V_{cc2(P)} = n \times V_{th},$$

wherein $V_{th}$ designates the threshold voltage of the MOST $Q_C$. Moreover, the gradient after the point P is determined similarly to the above by the resistor $R_1$ and by the equivalent ON resistance $n \cdot R_{QC}$.

Figure 27:
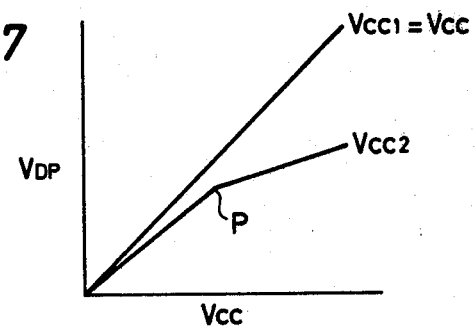

FIG. 23 shows voltage dividing means which is constructed by adding a resistor $R_3$ in parallel to the series MOSTs $Q_C$ of the voltage dividing means of FIG. 22. If the means of FIG. 23 is used, the internal power source voltage $V_{cc2}$ of FIG. 27 can be generated.

Figure 24:
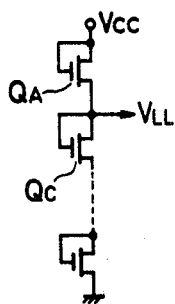

FIG. 24 shows an example, in which the resistor $R_1$ of FIG. 22 is replaced by an MOST $Q_4$. This MOST $Q_4$ may be of either enhancement or depletion type.

Figure 26:
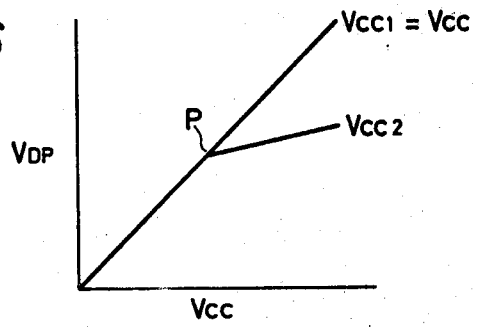

FIG. 26 shows an example, in which the MOST $Q_A$ is of the depletion type having its gate and source connected.

Figure 25:
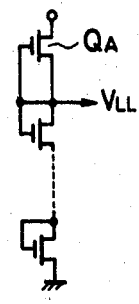
Figure 28:
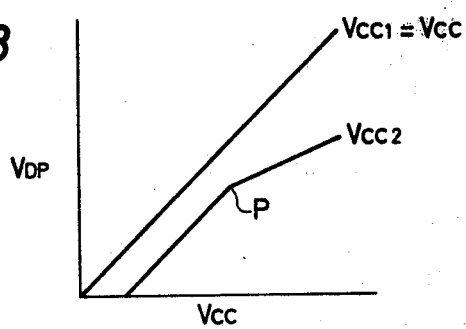

If the voltage dividing means of FIGS. 24 and 25 are used, the internal power source voltage $V_{cc2}$ of FIG. 28 can be generated.

Figure 29:
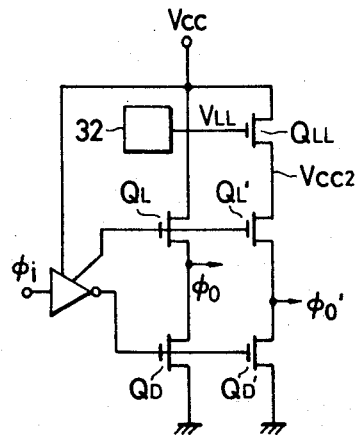
Figure 30:
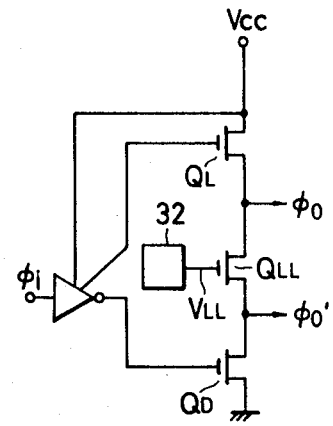

In the dynamic memory for generating the variable internal power source voltage $V_{cc2}$ with the use of the various voltage dividing means thus far described, the voltage converter to be used in the indirect peripheral circuit corresponds thereto. FIGS. 29 and 30 show examples thereof, in which the enhancement type MOST $Q_{LL}$ having its gate connected with the voltage dividing means 32 is inserted in place of the depletion type MOSTs $Q_{DN}$ of FIGS. 14 and 15, respectively. Either of these circuits converts the input pulses $\phi_i$ having the amplitude $V_{cc}$ into the pulse signals $\phi_0'$ having the amplitude $V_{cc2}$.

Figure 31:
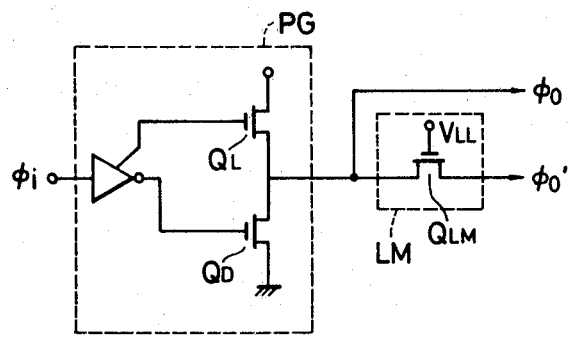

FIG. 31 shows another voltage converter, in which a voltage limitter LM is connected in series with the output of the usual pulse generator PG thereby to generate the pulse signals $\phi_0'$ having the amplitude $V_{cc2}$. The voltage limitter LM is constructed of the enhancement type MOST $Q_{LM}$ which has its gate fed with the voltage $V_{LL}$ generated by the aforementioned voltage dividing means 32.

Figure 32A:
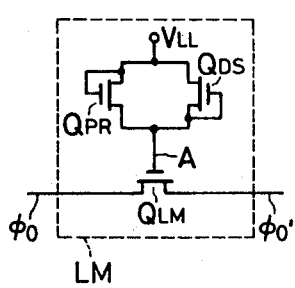
FIGS. 32a and 32b are a circuit diagram and a time chart showing a modification of a block LM of FIG. 31.
Figure 32B:
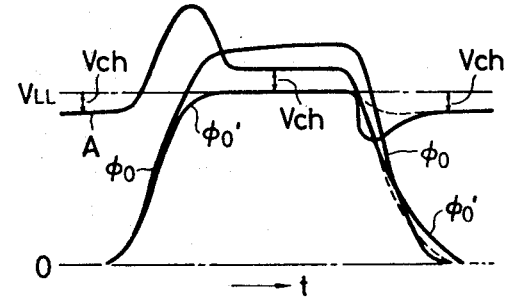

FIG. 32a shows another embodiment of the voltage limitter LM. This embodiment has more excellent electric characteristics than those of the voltage limitter of FIG. 31. Specifically, this embodiment can operate at a higher speed because it makes use of the self-boost trap effect resulting from the gate capacitance of the MOST $Q_{LM}$. The summary of the operations will be described with reference to FIG. 32b. A node A is precharged at the potential of $V_{LL} - V_{th}$ by the action of an MOST $Q_{PR}$. When the pulses $\phi_0$ then rise, the potential at the point A is raised by the capacitance combination because a reversible capacitor $C_G$ is formed between the gate, and the source and drain of an MOST $Q_{LM}$. As a result, the effective gate voltage of the MOST $Q_{LM}$ is raised whereas the ON resistance of the MOST $Q_{PR}$ is reduced so that the output pulses $\phi_0'$ are increased with a similar rise to that of the pulses $\phi_0$. Although the potential $V_A$ at the point A rises with the pulses $\phi_0$, an MOST $Q_{DS}$ is rendered conducting, when the potential $V_A$ exceeds the sum of the voltages $V_{LL}$ and $V_{th}$, so that a current path is formed in the direction from the point A to the voltage $V_{LL}$. As a result, the potential at the point A starts to drop in accordance with the time constant, which is determined by the ON resistances of the capacitor $C_G$ and the MOST $Q_{DS}$, until it is stabilized at the point of the sum of the voltages $V_{LL}$ and $V_{th}$. The final output voltage $V_{cc}$ of the pulses $\phi_0'$ is expressed by the Equation of $V_{cc2} = V_A - V_{th}$ (of $Q_{LM}$). As a result, if the threshold voltages of the MOSTs $Q_{DS}$ and $Q_{LM}$ are set at an equal level, the values of the voltages $V_{cc2}$ and $V_{LL}$ become identical so that the design of the $V_{LL}$ generating circuit can be remarkably facilitated. Next, when the pulses $\phi_0$ start their drop, the pulses $\phi_0'$ likewise drop. At this time, the potential at the point A is dropped by the combination of the capacitor $C_G$ so that breaking time of the pulses $\phi_0'$ is more or less delayed. However, if the ON resistance of the MOST $Q_{PR}$ is set at a low level, the drop of the potential at the point A can be minimized, as indicated at a broken line in FIG. 32b, so that the delay can be reduced.

Figure 33:
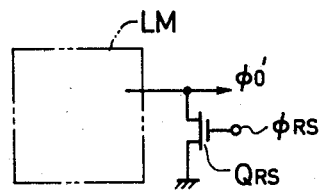

FIG. 33 shows an example in case it is necessary to further speed up the breaking time, and correspond to an example in which a discharging MOST $Q_{RS}$ is added to the output terminal of the voltage limitter LM. According to this embodiment, it is possible to effect the break at a high speed. In the case of the dynamic memory, all the pulses are simultaneously reset in most cases so that a resetting signal $\phi_{RS}$ can be commonly used with another. However, this addition of the signal raises no special problem.

Figure 34A:
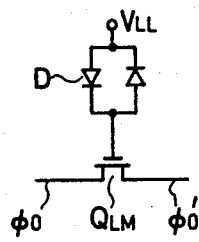
Figure 34B:
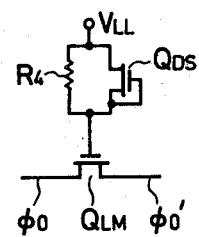
Figure 34C:
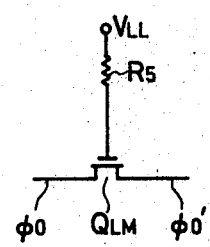
Figure 35A:
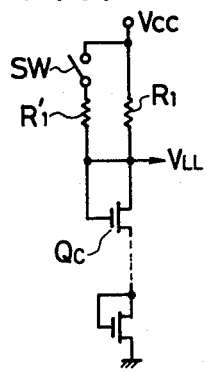
FIGS. 35a and 35b are a circuit diagram and a characteristic graph showing a modification of the block 32 of FIG. 19, respectively.
Figure 35B:
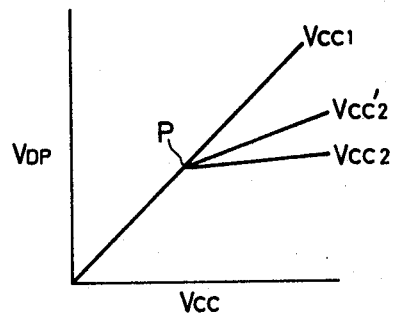
Figure 36A:
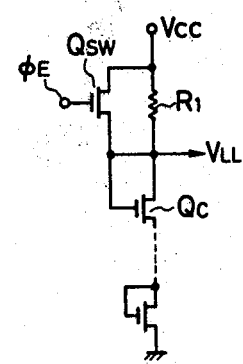
FIG. 36a is a circuit diagram showing another modification of the block 32.

FIGS. 34 to 36 show other examples of the voltage limitter LM.

FIG. 34 shows an example in which the MOST is replaced by diodes. According to this example, the value of the voltage $V_{cc2}$ is so more or less complicated as is expressed by the Equation of $V_{cc2} = V_{LL} + V_F - V_{th}$, but the operations are absolutely the same as those of the voltage limitter of FIG. 32.

FIG. 35 shows an example, in which the MOST $Q_{PR}$ is replaced by a resistor $R_4$ and which is effective to improve the breaking time.

FIG. 36 is an example, in which the MOSTs $Q_{PR}$ and $Q_{DS}$ are replaced by a resistor $R_5$ and by which operations similar to those of FIG. 31 can be obtained.

There have been described hereinbefore a variety of embodiments, in which the value of the internal power source voltage $V_{cc2}$ can be varied in accordance with the variation in the external power source voltage $V_{cc}$ so that a proper aging test can be conducted merely by varying the voltage $V_{cc}$. In order to stabilize the operations of the memory array or the direct peripheral circuit, on the contrary, the value of the voltage $V_{cc2}$ is held substantially constant during the usual operation but can be varied at a predetermined ratio to the voltage $V_{cc}$ only during the aging test.

FIG. 35a shows an example of the voltage dividing means 32 for generating such voltage $V_{cc2}$. In this example, an equality of $R_1 >> R_1'$ is set, and a switch SW is closed only during the aging test. During the usual operation, then, the voltage $V_{cc2}$ is hardly dependent upon the voltage $V_{cc}$ after the point P similarly to the voltage $V_{cc2}$ of FIG. 35a, but the changing rate can be enlarged, as indicated at $V_{cc2}'$, only during the aging test.

FIG. 36 shows an example, in which the switch SW is replaced by an MOST $Q_{SW}$ and in which the resistor $R_1'$ also acts as the MOST $Q_{SW}$. During the aging test, pulses $\phi_E$ have their voltages raised to render the MOST Q_{SW} conducting so that the characteristics shown in FIG. 35b can be obtained.

What is claimed is:

1. A semiconductor integrated circuit comprising:
    a first circuit including means for converting an external power source voltage to an internal power source voltage which is smaller than the external power source voltage;
    a second circuit supplied with the external power source voltage and responsive to first signals which regulate an operation of the integrated circuit, said second circuit including means for generating second signals which control the integrated circuit so that the integrated circuit performs the regulated operation, the second circuit comprising, as a part thereof, first transistors supplied with the external power source voltage and responsive to the first signals, wherein the second signals have amplitudes smaller than those of the first signals; and
    a third circuit supplied with the internal power source voltage and responsive to the second signals for performing the regulated operation, said third circuit comprising, as a part thereof, second transistors which are supplied with the internal power source voltage and which have a smaller size than that of the first transistors.

2. A semiconductor integrated circuit according to claim 1, wherein said first circuit includes means for holding said internal power source voltage at a predetermined level even if said external power source voltage varies to a higher level than said predetermined level.

3. A semiconductor integrated circuit according to claim 2, wherein said second circuit includes means for holding the higher level of said second signal at a predetermined level even if the higher level of said first signal varies to a higher level than a predetermined level.

4. A semiconductor integrated circuit according to claim 1, wherein the area occupied by said third circuit is larger than that occupied in said integrated circuit by said second circuit.

5. A semiconductor integrated circuit according to claim 1, wherein said third circuit includes a plurality of identical circuit elements arranged in an array.

6. A semiconductor integrated circuit according to claim 5, wherein said third circuit includes: pluralities of word lines, data lines and memory cells, which are arranged in an array, respectively; and a fourth circuit directly connected with said word lines and said data lines, and wherein said second circuit is made operative to control the operation of said third circuit in response to an address signal which is received thereby as said first pulse signal.

7. A semiconductor integrated circuit according to claim 6, wherein said second circuit includes: a circuit responsive to said address signal received for generating an internal address signal, which varies within the same voltage range as that of said internal power source voltage, as one of said second signals; and a circuit for generating pulses for driving said word lines as another of said second signals, and wherein said third circuit includes: a circuit for feeding said word line drive pulses to the word line, which is designated by said internal address signal; a common data line shared among said plural data lines; and a circuit for connecting the data line, which is designated by said internal address signal, with said common data line.

8. A semiconductor integrated circuit according to claim 7, wherein said word line drive pulse generating circuit is a circuit for generating a plurality of word line drive pulses, and wherein said word line drive pulse feeding circuit is made responsive to said plural word line drive pulses for boosting the voltage of said designated word line to a voltage which is higher than said internal power source voltage.

9. A semiconductor integrated circuit according to claim 7 or 8, wherein said second circuit further includes means for generating a pre-change pulse which has a higher voltage than the internal power source voltage, and wherein the third circuit further includes a circuit responsive to the pre-change pulse for pre-changing the data lines to the internal power source voltage.

10. A semiconductor integrated circuit according to claim 1, wherein said first and second circuits include a plurality of insulated gate type field effect transistors, and wherein said third circuit includes a plurality of insulated gate type field effect transistors having smaller gate oxide film thickness, channel length and threshold voltage than those of the transistors of said first and second circuits.

11. A semiconductor integrated circuit according to claim 1, wherein said third circuit has a smaller element separation width than that of the circuit elements of said first and second circuits.

12. A semiconductor integrated circuit according to claim 1, wherein the thickness of an insulating film of said integrated circuit, which is positioned on a semiconductor substrate between paired insulated gate type field effect transistors of said third circuit, is made smaller than that of an insulating film of said integrated circuit which is positioned on said semiconductor substrate between paired insulated gate type field effect transistors of said first and second circuits.

13. A semiconductor integrated circuit according to claim 1, wherein a depth of diffusion layers which form sources or drains of the second transistors are smaller than those of diffusion layers which forms sources or drains of the first transistors.

14. A semiconductor integrated circuit according to claim 1, wherein the first circuit includes means for providing the internal power source voltage which changes by a first amount smaller than an amount of change of the external power source voltage.

15. A semiconductor integrated circuit according to claim 14, wherein the providing means includes means for dividing the external power source voltage with a fixed dividing ratio to provide the divided voltage as the internal power source voltage.

16. A semiconductor integrated circuit according to claim 15, wherein the dividing means comprises two resistor means connected serially.

17. A semiconductor integrated circuit according to claim 14, wherein the providing means comprises first means for providing the internal power source voltage which changes by the first amount which is smaller than a second amount of change of the external power source voltage, when the external power source voltage is within a predetermined voltage range including a predetermined normal voltage, and for providing the internal power source voltage which changes by a third amount of change which is between the first and second amount of change, when the external power source voltage is less than the voltage range.

18. A semiconductor integrated circuit according to claim 17, wherein the providing means comprises a diode means and a resistor means connected serially for generating the internal power source voltage from a connection point of the diode means and the resistor means.

19. A semiconductor integrated circuit according to claim 17, wherein the providing means comprises plural diode means connected serially for generating the internal power source voltage from one of connections of the plural diode means.

20. A semiconductor integrated circuit according to claim 14, wherein the providing means includes means responsive to an aging signal for providing the internal power source voltage which changes by an amount larger than the first amount.

21. A semiconductor integrated circuit according to claim 20, wherein the providing means is connected to a pad to which the aging signal is supplied.

22. A semiconductor integrated circuit according to claim 21, further comprising means responsive to the first signals for generating the aging signal when a specific combination of the first signals occurs which never occurs during a normal operation.

23. A semiconductor integrared circuit according to claim 1, wherein the second circuit includes:
 a field effect transistor means having a source electrode supplied with one of the first signals;
 first diode means having a cathode connected to a gate electrode of the transistor means and an anode connected to the internal power supply voltage; and
 second diode means having an anode connected to the gate electrode and a cathode connected to the internal power supply means,
 thereby to provide a corresponding second signal from a drain electrode of the transistor means.

* * * * *